(12) United States Patent
Zhang et al.

(10) Patent No.: US 11,211,475 B2
(45) Date of Patent: Dec. 28, 2021

(54) SEMICONDUCTOR DEVICE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Haiyang Zhang, Shanghai (CN); Jian Chen, Shanghai (CN); Bo Su, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/914,441

(22) Filed: Jun. 28, 2020

(65) Prior Publication Data
US 2020/0411670 A1 Dec. 31, 2020

(30) Foreign Application Priority Data
Jun. 28, 2019 (CN) .......................... 201910571636.4

(51) Int. Cl.
*H01L 29/66* (2006.01)
*H01L 29/78* (2006.01)
*H01L 21/02* (2006.01)
*H01L 21/265* (2006.01)
*H01L 21/8234* (2006.01)

(52) U.S. Cl.
CPC .... *H01L 29/66795* (2013.01); *H01L 21/0228* (2013.01); *H01L 21/26566* (2013.01); *H01L 21/823431* (2013.01); *H01L 29/7851* (2013.01)

(58) Field of Classification Search
CPC ............. H01L 29/665; H01L 21/31053; H01L 21/31111; H01L 21/32133; H01L 29/42372; H01L 29/66545
See application file for complete search history.

(56) References Cited

U.S. PATENT DOCUMENTS 10,121,874 B2 * 11/2018 Zhang ............... H01L 21/76885
2013/0001652 A1 * 1/2013 Yoshikawa ........... H01L 27/228
257/252

* cited by examiner

*Primary Examiner* — Zandra V Smith
*Assistant Examiner* — Andre C Stevenson
(74) *Attorney, Agent, or Firm* — Anova Law Group, PLLC

(57) ABSTRACT

A method of forming a method of forming a semiconductor device includes providing a semiconductor structure, etching back each gate structure of a plurality of gate structures to form an opening, forming a barrier layer over the dielectric layer, forming a sacrificial layer over the barrier layer, planarizing the sacrificial layer till a surface of the sacrificial layer is substantially flat, and using a gas cluster ion beam (GCIB) process to planarize the sacrificial layer and the barrier layer, and to remove the sacrificial layer and to provide a planarized barrier layer. The semiconductor structure includes a semiconductor substrate, a fin, the plurality of gate structures, and a dielectric layer over the semiconductor substrate between adjacent gate structures. A top of the dielectric layer is coplanar with a top of each of the plurality of gate structures.

17 Claims, 6 Drawing Sheets

SEMICONDUCTOR DEVICE AND FORMATION METHOD THEREOF

CROSS-REFERENCE TO RELATED APPLICATION

This application claims priority to Chinese Patent Application No. 201910571636.4, filed on Jun. 28, 2019, the entire content of which is incorporated herein by reference.

TECHNICAL FIELD

The present disclosure generally relates to the semiconductor fabrication field and, more particularly, to a semiconductor device and a formation method thereof.

BACKGROUND

With development of integrated circuits (ICs) to ultra-large-scale ICs, an internal circuit density of an IC is getting bigger and bigger, more and more components are included, and the size of the components is also getting smaller. As the circuit density increases, a wafer surface may not be able to provide enough area to fabricate connection wires. To interconnect the shrunk components, a design of two or more layers of intermetallic interconnection wires becomes one of the common methods used in the technology of the ultra-large-scale ICs. Plugs are used to connect different metal layers or a metal layer and a semiconductor device.

However, a width of a plug structure formed inside the interlayer dielectric layer is greater than a distance between adjacent gate structures, which may cause a short-circuit failure of the gate and affect the performance and yield of a semiconductor structure. To avoid the short-circuit failure of the gate, a capping layer is formed over the gate structure to avoid contacting with the plug structure to cause the short-circuit failure.

However, the electrical performance of the semiconductor device formed by the existing technology needs to be improved.

SUMMARY

Embodiments of the present disclosure provide a method of forming a semiconductor device. The method includes providing a semiconductor structure, etching back each gate structure of a plurality of gate structures to form an opening, forming a barrier layer over the dielectric layer, wherein the barrier layer fills up the opening, forming a sacrificial layer over the barrier layer, planarizing the sacrificial layer till a surface of the sacrificial layer is substantially flat, and using a gas cluster ion beam (GCIB) process to planarize the sacrificial layer and the barrier layer, and to remove the sacrificial layer and to provide a planarized barrier layer. The semiconductor substrate includes a semiconductor substrate, a fin over the semiconductor substrate, the plurality of gate structures across the fin, and a dielectric layer over the semiconductor substrate between adjacent gate structures. A top of the dielectric layer is coplanar with a top of each of the plurality of gate structures.

Embodiments of the present disclosure provide a semiconductor device, including a semiconductor structure and a barrier layer. The semiconductor structure includes a semiconductor substrate, a fin over the semiconductor substrate, a plurality of gate structures across the fin, and a dielectric layer over the semiconductor substrate between adjacent gate structures. A top of the dielectric layer is higher than a top of each of the plurality of gate structures to provide an opening over each of the plurality of gate structures. The barrier layer is formed over the dielectric layer and filling up the opening. The barrier layer includes a planarized barrier layer after a gas cluster ion beam (GCIB) planarization. Other aspects of the present disclosure can be understood by those skilled in the art in light of the description, the claims, and the drawings of the present disclosure.

DETAILED DESCRIPTION

Figure 1:
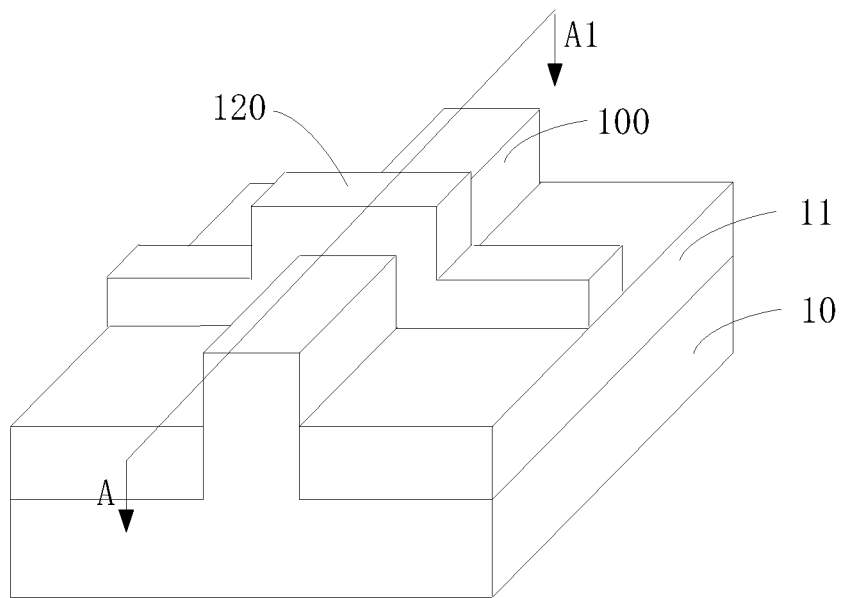
FIG. 1 illustrates a schematic 3D structural diagram of a fin-type field-effect transistor (Fin FET) according to some embodiments of the present disclosure.

As described in the technical background, a capping layer is formed over a gate structure to prevent short-circuit between a gate contact and a plug contact, so as to reduce sensitivity of a contact to a short-circuit failure of the gate.

Nowadays, when the capping layer is formed over the gate structure, a layer of a cap material is first deposited over a surface of a semiconductor device, such that the cap material covers the surface of the semiconductor device and fills the gate groove. Then, a mechanical grinding process is performed to expose the surface of the semiconductor device to make the capping layer just inside the gate groove to protect the gate. However, due to varying density degrees of the semiconductor device, when one layer of the capping layer material is deposited over the surface of the semiconductor device, the capping layer material may appear unevenly. Therefore, when the mechanical grinding is performed, a chemical mechanical polishing (CMP) method may be used to remove various types of thin films. However, in some embodiments, the CMP may cause a wafer or a die to be uneven, which may further affect a lithography process of forming a tiny component. The polishing thickness may not be controlled well, and the process is difficult to control, which makes the performance of the semiconductor device unstable.

To solve the described technical problems, the present disclosure provides a method for forming a semiconductor structure. The method includes providing a semiconductor structure, etching back each gate structure of the plurality of gate structures to form an opening, forming a barrier layer over the dielectric layer, forming a sacrificial layer over the barrier layer, planarizing the sacrificial layer till a surface of the sacrificial layer is substantially flat, using a gas cluster ion beam (GCIB) process to planarize the sacrificial layer and the barrier layer, and to remove the sacrificial layer and to provide a planarized barrier layer, performing a surface modulation to form a dielectric barrier layer in the barrier layer, and performing a feedforward process of a gas cluster ion beam to remove the dielectric barrier layer, thereby a remaining barrier layer has a controlled thickness. The semiconductor structure includes a semiconductor substrate, a fin over the semiconductor substrate, a plurality of gate structures across the fin, and a dielectric layer over the semiconductor substrate between adjacent gate structures. A top of the dielectric layer is coplanar with a top of each of the plurality of gate structures. The barrier layer fills up the opening. By forming the sacrificial layer over the barrier layer, the sacrificial layer facilitates the CMP process to polish the surface of the sacrificial layer. Then, the GCIB process is used to remove the sacrificial layer and thin down the barrier layer, such that the thickness of the barrier layer may be controlled well, the performance stability of the semiconductor device is improved.

To make the above-described objectives, features, and advantages of the present disclosure more comprehensible, some embodiments of the present disclosure are described in detail below in connection with the accompanying drawings.

Figure 10:
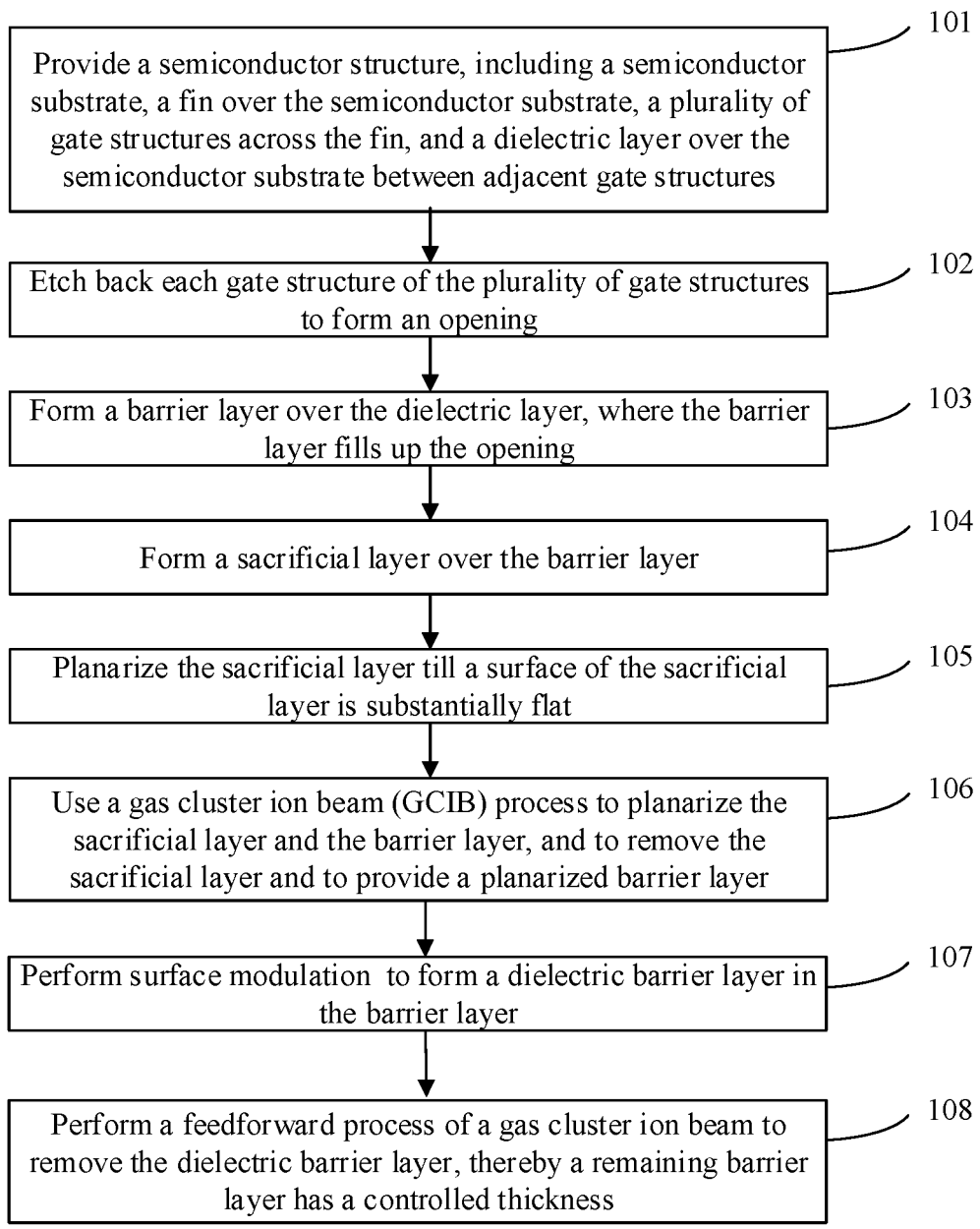
FIG. 10 illustrates a flowchart of an exemplary method for forming a semiconductor device according to some embodiments in the present disclosure.

Referring to FIG. 10, a semiconductor substrate is provided, including a semiconductor substrate, a fin over the semiconductor substrate, a plurality of gate structures across the fin, and a dielectric layer over the semiconductor substrate between adjacent gate structures (S101). FIG. 1 illustrates a schematic 3D structural diagram of a fin-type field effect transistor (Fin FET) according to some embodiments of the present disclosure.

Referring to FIG. 1, a semiconductor substrate 10 is provided. A fin 100 is over the semiconductor substrate 10. A dummy gate structure 120 is formed across the fin 100 over the semiconductor substrate 10.

In some embodiments, the material of the semiconductor substrate 10 includes single crystal silicon. In some other embodiments, the material of the semiconductor substrate 10 may also include polycrystal Si, amorphous Si, amorphous germanium, germanium, silicon germanium, silicon carbide, gallium arsenide or indium gallium, etc.

In some other embodiments, the semiconductor substrate 10 may further include a silicon substrate over an insulator, a germanium substrate over an insulator, a glass substrate, or other types of semiconductor substrates 10. The material of the semiconductor substrate 10 may include a material that is suitable for processing requirements or easy to integrate.

In some embodiments, the material of the fin 100 includes the same material of the semiconductor substrate 10, which is single crystal silicon. In some other embodiments, the material of the fin 100 may also include a material different from the material of the semiconductor substrate 10. The material of the fin 100 may further include germanium, silicon germanium, silicon carbide, gallium arsenide, or indium gallium, etc.

In some embodiments, the semiconductor substrate 10 and the fin 100 may be formed simultaneously. The processes for forming the semiconductor substrate 10 and the fin 100 includes providing an initial substrate, forming a fin mask (not shown) over a surface of the initial substrate, and using the fin mask as a mask to etch the initial substrate to remove a portion of the initial substrate to form the semiconductor substrate 10 and the fin 100, which protrudes from the surface of the semiconductor substrate 10.

In some embodiments, the semiconductor structure includes an isolation structure 11. The isolation structure 11 covers the surface of the semiconductor substrate 10 and a portion of the side surface of the fin 100. The isolation structure 11 may be used as an isolation structure of the semiconductor structure, which may electrically isolate between adjacent devices and adjacent fins.

In some embodiments, the material of the isolation structure 11 includes silicon dioxide. In some other embodiments, the material of the isolation structure 11 may further include other insulating materials such as silicon nitride, silicon oxynitride, etc.

A dummy gate structure 120 is across the fin 100 and covers the top and side surfaces of the fin 100. For the Fin FET, the top of the fin 100 and the portions of the side surfaces on both sides that contact the dummy gate structure 120 become a channel region, which is beneficial to increase driving current and improve the performance of the device.

FIG. 2 to FIG. 7 illustrate schematic views of cross-sectional structures at certain stages during formation process of an exemplary semiconductor device according to some embodiments of the present disclosure.

Figure 2:
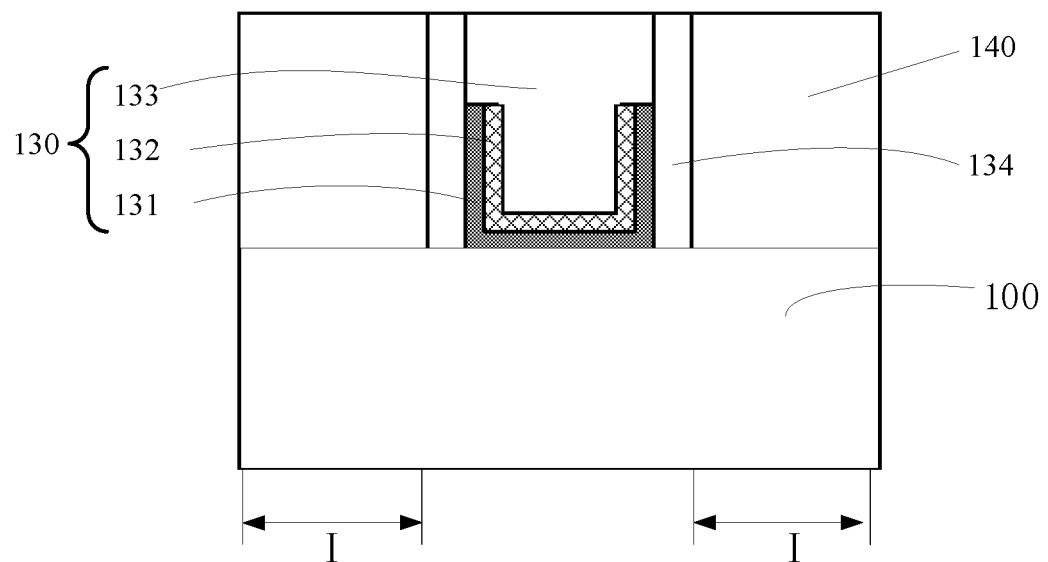
FIG. 2 to FIG. 9 illustrate schematic views of cross-sectional structures at certain stages during a process of forming an exemplary semiconductor device according to some embodiments of the present disclosure.

FIG. 2 is a cross-sectional view of FIG. 1 along AA1 direction (a portion below the fin is not shown in FIG. 2).

Referring to FIG. 2, a dielectric layer 140 is formed over the semiconductor substrate 10 between the dummy gate structures 120 shown in FIG. 1.

In some embodiments, the semiconductor structure further includes a source-drain-doped region I located in the fin 100 of both sides of the dummy gate structure 120.

In some embodiments, the dielectric layer 140 is over the source-drain-doped region I. The source-drain-doped region I may be served as a source region or a drain region (not shown) of the formed fin transistor.

The dielectric layer 140 is used to electrically isolate the adjacent semiconductor devices.

In some embodiments, the material of the dielectric layer 140 includes silicon dioxide. In some other embodiments, the material of the dielectric layer 140 may further include other dielectric materials such as silicon nitride, silicon oxynitride, etc.

In some other embodiments, before the dielectric layer 140 is formed, a stress layer (not shown) may also be formed in the fins 100 on both sides of the dummy gate structure 120.

Referring to FIG. 2, the dummy gate structure 120 shown in FIG. 1 is removed to form a gate opening in the dielectric layer 140. A gate dielectric layer 131 is formed over the side surfaces and the bottom of the gate opening. A work function layer 132 is formed over the gate dielectric layer 131. An electrode layer 133 is formed over the work function layer 132, and the electrode layer 133 fills the gate opening. The gate dielectric layer 131, the work function layer 132, and the electrode layer 133 form a gate structure 130. A top of the gate dielectric layer 131 is coplanar with a top of the work function layer 132. The electrode layer 133 covers the work function layer 132 and the gate dielectric layer 131 from the top. A top of the electrode layer 133 is above the top of the dielectric layer 131 and the top of the work function layer 132. The top of the electrode layer 133, i.e., the top of the gate structure 130, is coplanar with the top of the dielectric layer.

In some embodiments, after the dummy gate structure 120 is formed and before the stress layer is formed, the formation method also includes forming a sidewall 134 over the side surface of the dummy gate structure. After the dummy gate structure 120 is subsequently removed, the side surface of the formed gate opening exposes the sidewall 134. Therefore, the side surface of the gate structure 130 formed in the gate opening is covered with the sidewall 134, that is, the sidewall 134 is formed over the side surface of the gate structure 130.

The sidewall 134 includes a protection sidewall covering the side surface of the dummy gate structure and an offset sidewall located over the protection sidewall. Therefore, the sidewall 134 is used to protect the side surface of the dummy gate structure and further used to define the location of the source-drain-doped region I.

In some embodiments, materials of the sidewall 134 may include one or more of silicon dioxide, silicon nitride, silicon carbide, silicon carbonitride, silicon oxycarbonitride, silicon oxynitride, boron nitride, and boron carbonitride. The sidewall 134 may include a single-layer structure or a stacked-layer structure.

Referring to FIG. 10, each gate structure of the plurality of gate structures is etched back to form an opening (S102).

Figure 3:
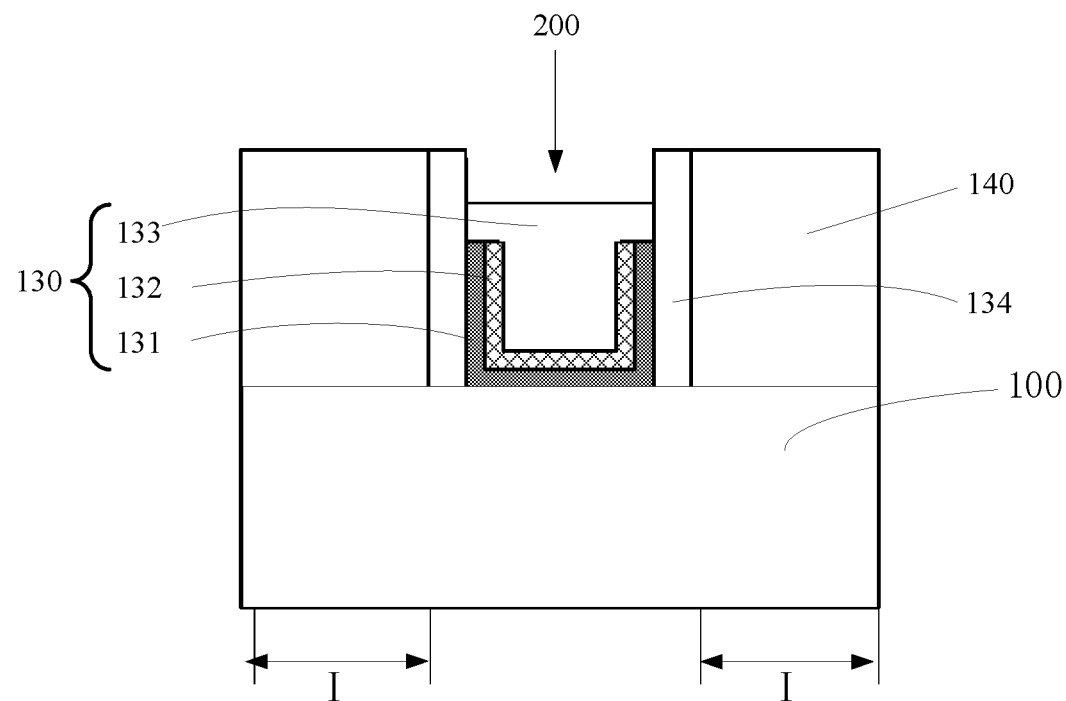

FIG. 3 illustrates a schematic view of a cross-sectional structure of a corresponding exemplary semiconductor device. A portion of the thickness of the electrode layer 133 in the gate structure 130 is etched back, and an opening 200 is formed in the dielectric layer 140. The electrode layer 133 still covers the work function layer 132 and the gate dielectric layer 131 from the top. The top of the electrode layer 133 is lower than the top of the dielectric layer 140 and still above the top of the dielectric layer 131 and the top of the work function layer 132.

In some embodiments, a method for etching the portion of the thickness of the electrode layer 133 includes a dry etching method. The dry etching process includes a reactive ion etching process. The dry etching process parameters include: the reaction gas includes carbon tetrafluoromethane, sulphur hexafluoride, and Argon); the flow rate of carbon tetrafluoromethane is 50 standard ml/min (sccm) to 100 sccm, the flow rate of sulphur hexafluoride is 10 sccm to 100 sccm, and the flow rate of Argon is 100 sccm to 300 sccm; the source power is 50 W to 1000 W, and the bias power is 50 W to 250 W; and the chamber pressure is 50 mTorr to 200 mTorr, and the chamber temperature is 20° C. to 90° C.

In some other embodiments, the method for etching the portion of the thickness of the electrode layer 133 includes a wet etching method.

Referring to FIG. 10, a barrier layer is formed over the dielectric layer, wherein the barrier layer fills up the opening (S103).

Figure 4:
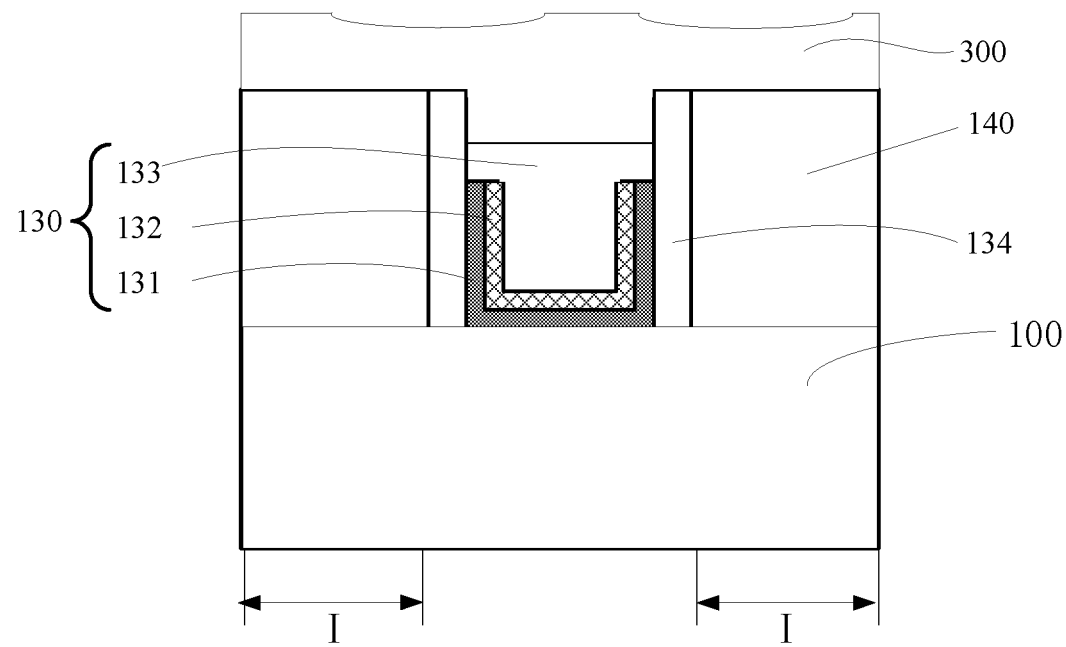

FIG. 4 illustrates a schematic view of a cross-sectional structure of a corresponding exemplary semiconductor device. The material of the barrier layer 300 includes silicon nitride. A method for forming the barrier layer 300 includes a deposition process, such as a physical vapor deposition (PVD) method or a chemical vapor deposition (CVD) method.

In some other embodiments, a material of the barrier layer 300 may also include another material that is suitable as a mask.

Due to the varying density degrees of the surface of the semiconductor device, after the barrier layer 300 is deposited, the surface of the barrier layer 300 may be uneven. The unevenness of the surface may cause the uneven thickness of the barrier layer 300. Thus, the thickness of the barrier layer 300 is difficult to control, which causes the performance of the semiconductor device to be unstable.

Referring to FIG. 10, a sacrificial layer is formed over the barrier layer (S104).

Figure 5:
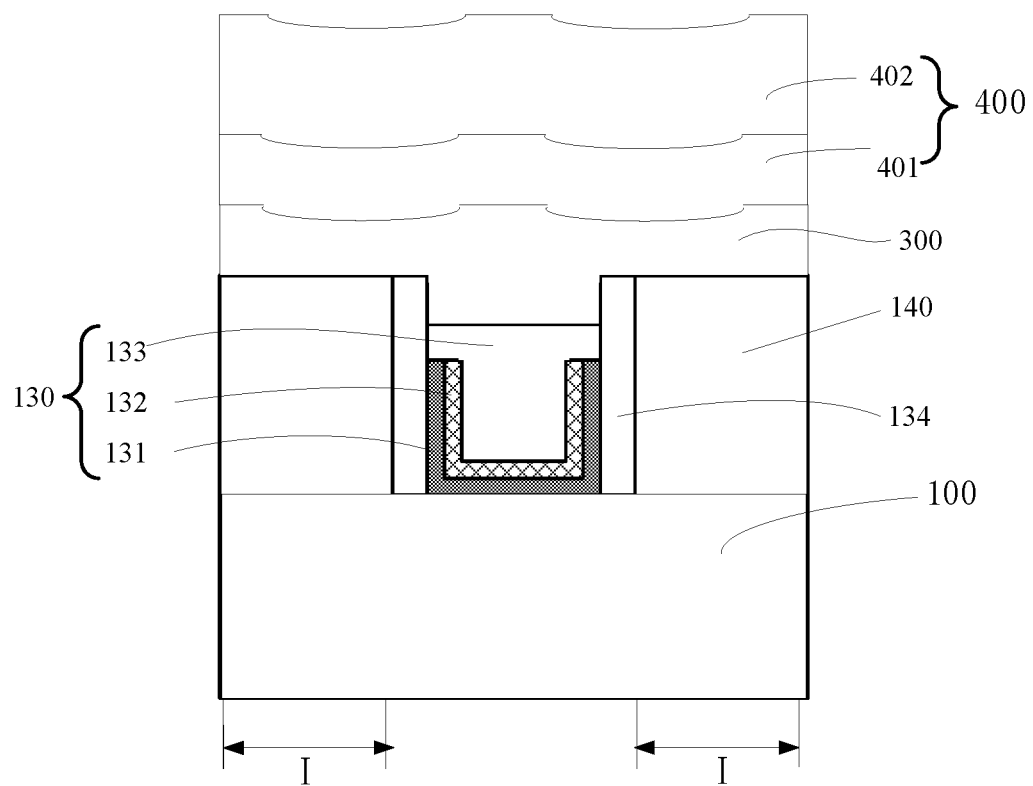

FIG. 5 illustrates a schematic view of a cross-sectional structure of a corresponding exemplary semiconductor device. A sacrificial layer 400 is formed over the barrier layer 300.

In some embodiments, the processes of forming the sacrificial layer 400 include forming a first sacrificial layer 401 over the barrier layer 300, and forming a second sacrificial layer 402 over the first sacrificial layer 401. The objective of depositing the sacrificial layer 400 over the barrier layer 300 is to make the material of the sacrificial layer 400 fill a concave structure on the surface of the barrier layer 300. The sacrificial layer 400 also facilitates the subsequent planarization process.

In some embodiments, forming the first sacrificial layer 401 and the second sacrificial layer 402 includes the CVD process, the PVD process, or an atomic layer deposition (ALD) process.

In some embodiments, the material of the first sacrificial layer 401 includes amorphous silicon. The material of the second sacrificial layer 402 includes silicon dioxide.

In some other embodiments, the sacrificial layer 400 includes any one of the first sacrificial layer 401 or the second sacrificial layer 402.

In some embodiments, the thickness of the sacrificial layer 400 is 50 Å to 500 Å.

Referring to FIG. 10, the sacrificial layer is planarized till a surface of the sacrificial layer is substantially flat (S105).

Figure 6:
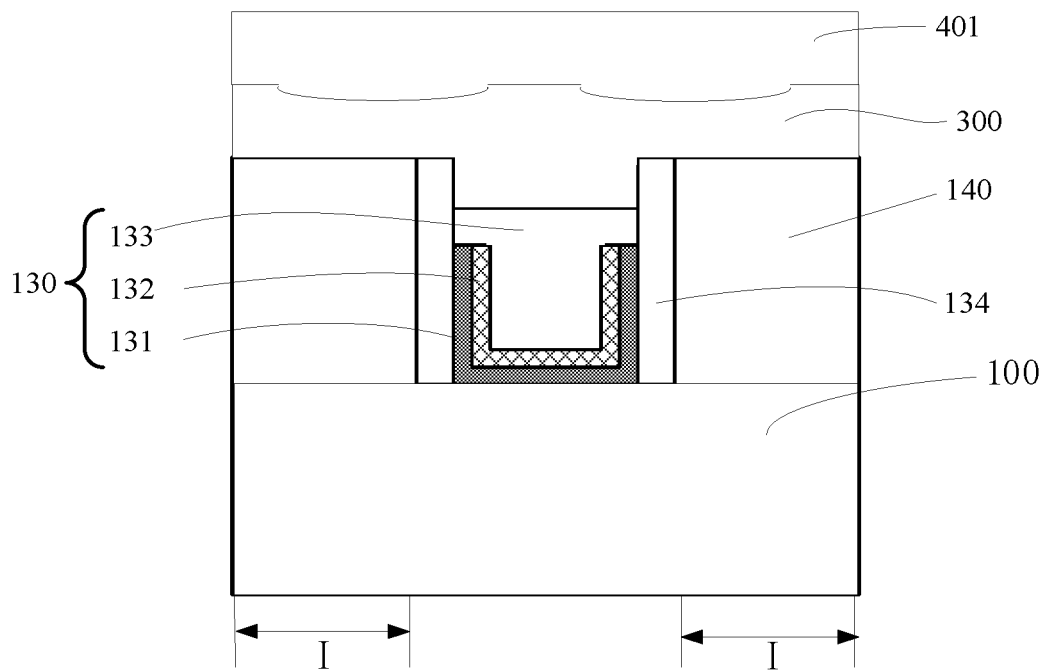

FIG. 6 illustrates a schematic view of a cross-sectional structure of a corresponding exemplary semiconductor device. The sacrificial layer 400 is planarized until the surface of the sacrificial layer 400 is substantially flat.

In some embodiments, the mechanical grinding process is used to remove the second sacrificial layer 402 and a portion of the thickness of the first sacrificial layer 401. The wet etching process (soft etch) is further used to remove a portion of the thickness of the first sacrificial layer 401. This method may remove a portion of the first sacrificial layer 401 scratched by the CMP process at the surface of the first sacrificial layer 401. The method facilities to planarize the surface of the sacrificial layer 400.

In some embodiments, in the wet etching process, an etching solution includes a hydrofluoric acid (HF) solution.

Referring to FIG. 10, a GCIB process is used to planarize the sacrificial layer and the barrier layer, and to remove the sacrificial layer and to provide a planarized barrier layer (106).

Figure 7:
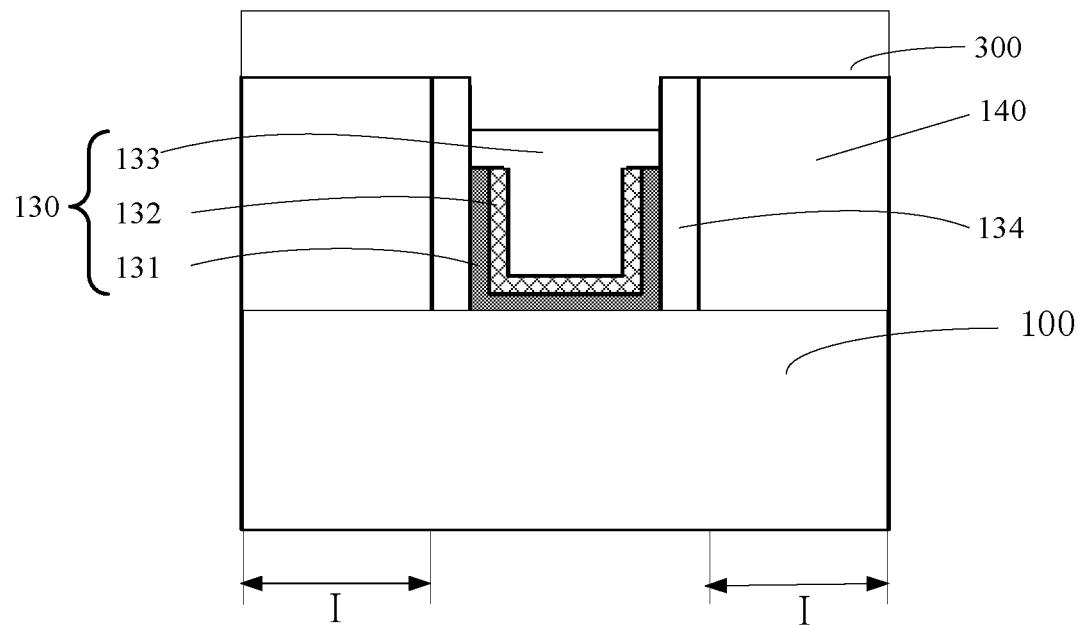

FIG. 7 illustrates a schematic view of a cross-sectional structure of a corresponding exemplary semiconductor device. The GCIB process is used to planarize the first sacrificial layer 401 (as shown in FIG. 6) and the barrier layer 300.

In some embodiments, the gas used in the GCIB process includes carbon tetrafluoride, oxygen, nitrogen trifluoride, trifluoromethyl, or difluoromethane. The gas energy is 2 KV~25 KV, and the gas dosage is 1.0E15~1.0E17 ions/cm$^2$.

The GCIB process is used to etch (or remove) the material and planarize the uneven surface, and the etching rate for any material is the same. A CMP process is used to polish the surface of the first sacrificial layer 401 with a uniform thickness. When the GCIB process is used, the GCIB system may identify the location and the thickness of the film that needs to be removed base on the provided information. Therefore, the etching thickness can be accurately controlled.

Referring to FIG. 10, a surface modulation is performed to form a dielectric barrier layer in the barrier layer (107). A feedforward process of a gas cluster ion beam is performed to remove the dielectric barrier layer, thereby a remaining barrier layer, thereby a remaining barrier layer has a controlled thickness (108).

Figure 8:
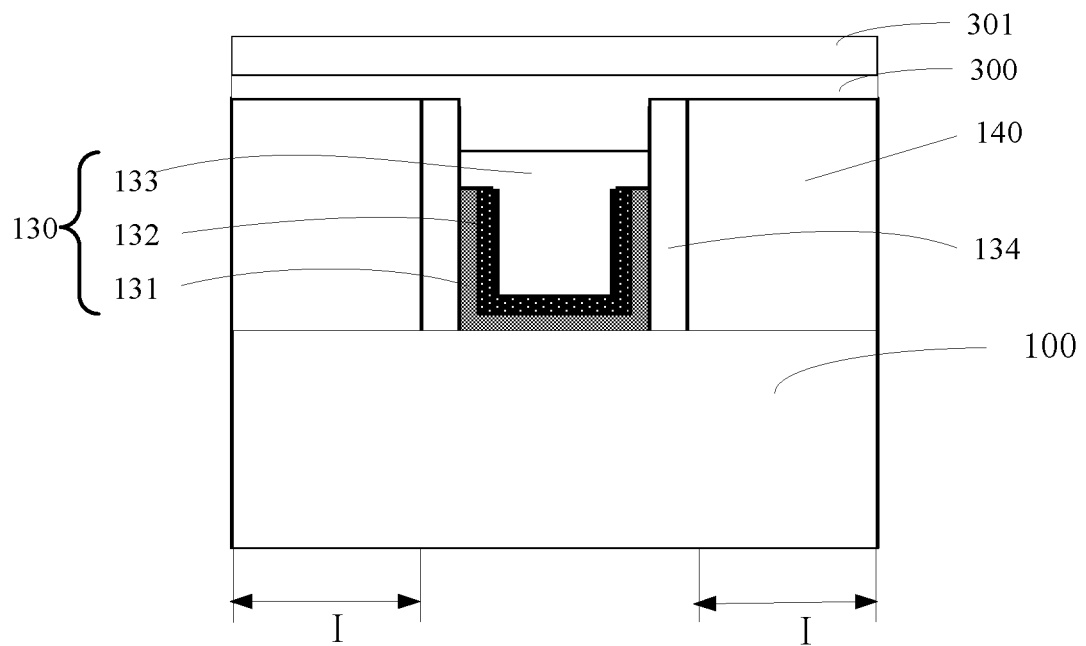

FIG. 8 illustrates a schematic view of a cross-sectional structure of a corresponding exemplary semiconductor device. A feedforward process of the GCIB process is used to further remove the dielectric barrier layer 301 to accurately control the thickness of the barrier layer 300.

In some embodiments, after the first sacrificial layer 401 (as shown in FIG. 6) and the barrier layer 300 are planarized by using the GCIB process. The method further includes using a feedforward process of the GCIB process to control the thickness of the barrier layer 300, and keeping the distance between the top of the barrier layer 300 and the top of the dielectric layer 140 as 0 Å to 30 Å. The method further includes calculating a thickness of the dielectric barrier layer 301 for performing the surface modulation of the barrier layer, such that the remaining barrier layer has the controlled thickness. After the surface modulation is performed, the dielectric barrier layer 301 is formed in the barrier layer 300 with the determined thickness.

In the feedforward process, a gaseous precursor is released from the gas cluster ion beam to form a gas cluster. The gaseous precursor may include an etching gas, which may be used to remove the dielectric barrier layer 301 (e.g., oxide, nitride, oxynitrides, or silicon-containing films, such as polysilicon), which may be used to determine the etch amount that is needed to therefore accurately determine an etching thickness. As such, a thickness of the barrier layer 300 may be controlled. In some embodiments, the etching process for removing the dielectric barrier layer 301 may include the dry etching or wet etching.

In some other embodiments, the gaseous precursor may include other suitable gaseous precursors. For example, the gaseous precursors may include carbide, fluorine-containing gas (e.g., CxFy or CmHnFo), halide (e.g., HBr), sulfur hexafluoride, Carbon-12, or hydrogen fluoride. In some embodiments, the gaseous precursors may also include an etching assist gas, such as oxygen, nitrogen, or ammonia. In some embodiments, the gaseous precursors may also include a carrier gas (diluent gas or passive gas), such as Argon, or helium. The gaseous precursors may further include one or more doped gases, such as diborane, phosphine, asine, or germanium hydride. Gases available in other forms may also be used as gaseous precursors for the GCIB.

In some embodiments, the distance between the top of the remaining barrier layer 300 and the top of the dielectric layer 140 is kept from 0 Å to 30 Å. The distance makes the barrier layer 300 fill up the opening while controlling the thickness of the barrier layer 300. The thickness of the remaining barrier layer 300 should not be too thick. When the thickness of the remaining barrier layer 300 exceeds 30 Å, the subsequent formation of the plug structure may be affected.

In some other embodiments, the barrier layer 300 may also only fills up the opening. That is, the first sacrificial layer 401 is removed by the GCIB process until the surface of the dielectric layer 140 is exposed. As such the barrier layer 300 is coplanar with the dielectric layer 140.

In some embodiments, after the barrier layer 300 is formed, the method further includes forming a through-hole in the dielectric layer 140 connecting to the source-drain-doped region I. The through-hole is filled with a conductive layer to form a conductive plug. The conductive plug is connected to the source-drain-doped region.

The through-hole is used to provide process space for forming the plug. The plug is configured to connect the source-drain-doped region I to an external circuit.

The barrier layer 300 serves as a mask during the subsequent formation of the plug to protect the gate structure 130.

The material of the plug includes one or more of tungsten, aluminum, silver, chromium, molybdenum, nickel, palladium, platinum, titanium, tantalum, or copper. The plug fills the through-hole. The plug is located at the stress layer, and electrically connected to the stress layer.

Figure 9:
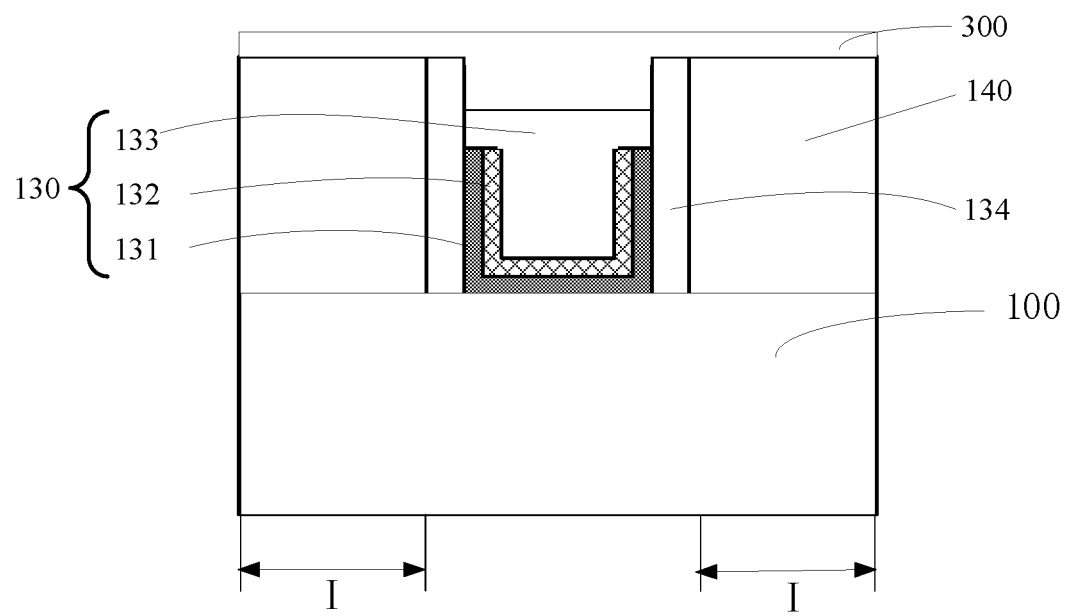

Referring to FIG. 9, the semiconductor device formed by the above-described formation method includes the semiconductor substrate (now shown), the fin 100, the gate structures 130, the dielectric layer 140, the opening, and the barrier layer 300. The fin 100 is over the semiconductor substrate. The gate structure 130 is across the fin 100. The dielectric layer 140 is over the semiconductor substrate between the adjacent gate structures 130. The opening is located at the gate structure 130. The barrier layer 300 is located in the opening and covers the top surfaces of the gate structure 130 and the dielectric layer 140. The thickness from the barrier layer 300 to the top of the dielectric layer 140 is 0 Å to 30 Å. The barrier layer 300 protects the gate structure 130 and reduces the average dielectric constant of the materials surrounding the gate structure to control the parasitic capacitance associated with the gate structure 130 and improve the performance of the formed semiconductor structure.

In some embodiments, the method of forming the barrier layer may further include forming the barrier layer over the dielectric layer, forming the first sacrificial layer over the barrier layer, forming the second sacrificial layer over the first sacrificial layer, using the oxide etch back and CMP to control the barrier layer thickness, and using GCIB process or etch back to further thin down the barrier layer. The material of barrier layer includes silicon nitride. The material of the first sacrificial layer includes amorphous silicon. The material of the second sacrificial layer includes silicon oxide. The gaseous precursors may include hydrogen, and He. The GCIB using hydrogen/helium may overcome the wafer-to-wafer silicon nitride variation and make sure the barrier layer with the same thickness.

Compared to the existing technology, the technical solution of the present disclosure includes following advantages. The method includes using the gas cluster ion beam process to remove the sacrificial layer and thin down the barrier layer at the same time. The gas cluster ion beam process has a same rate of action on any material when layers of different materials are etched or uneven surfaces are planarized. Therefore, when the sacrificial layer and the barrier layer are planarized, the GCIB process can control the thickness of the barrier layer well, such that the performance stability of the semiconductor device is improved.

Although the present disclosure is disclosed according to above-described embodiments, the present disclosure is not limited to above-described embodiments. Those skilled in the art can make various modifications and changes without departing from the spirit and scope of the present disclosure. Therefore, the scope of the present disclosure shall be subject to the scope defined by the claims.

What is claimed is:

1. A method of forming a semiconductor device, comprising:
   providing a semiconductor structure, including a semiconductor substrate, a fin over the semiconductor substrate, a plurality of gate structures across the fin, and a dielectric layer over the semiconductor substrate between adjacent gate structures, wherein a top of the dielectric layer is coplanar with a top of each of the plurality of gate structures;
   etching back each gate structure of the plurality of gate structures to form an opening;
   forming a barrier layer over the dielectric layer, wherein the barrier layer fills up the opening;
   forming a sacrificial layer over the barrier layer;
   planarizing the sacrificial layer till a surface of the sacrificial layer is substantially flat; and
   using a gas cluster ion beam (GCIB) process to planarize the sacrificial layer and the barrier layer, and to remove the sacrificial layer and to provide a planarized barrier layer.

2. The method of claim 1, further comprising:
performing a surface modulation to form a dielectric barrier layer in the barrier layer; and
performing a feedforward process of a gas cluster ion beam to remove the dielectric barrier layer, thereby a remaining barrier layer has a controlled thickness.

3. The method of claim 1, before performing the surface modulation, further including:
calculating a thickness of the dielectric barrier layer for performing the surface modulation of the barrier layer, such that the remaining barrier layer has the controlled thickness.

4. The method of claim 3, wherein the controlled thickness includes a distance between a top of the remaining barrier layer and the top of the dielectric layer, wherein the distance is controlled in a range from 0 Å to 30 Å.

5. The method of claim 1, wherein a gas used in the GCIB process includes carbon tetrafluoride, oxygen, nitrogen trifluoride, trifluoromethyl, or difluoromethane, gas energy is 2 KV~25 KV, and a gas dosage is 1.0E15~1.0E17 ions/$cm^2$.

6. The method of claim 1, further comprising:
using the GCIB process to planarize the remaining barrier layer to expose the dielectric layer.

7. The method of claim 1, wherein forming the sacrificial layer on the barrier layer includes:
forming a first sacrificial layer over the barrier layer, and forming a second sacrificial layer over the first sacrificial layer.

8. The method of claim 7, wherein a material of the first sacrificial layer includes amorphous silicon.

9. The method of claim 8, wherein a material of the second sacrificial layer includes silicon oxide.

10. The method of claim 8, wherein forming the first sacrificial layer and the second sacrificial layer includes a chemical vapor deposition (CVD) method, a physical vapor deposition (PVD) method, or an atomic layer deposition (ALD) method.

11. The method of claim 1, wherein a material of the barrier layer includes silicon nitride.

12. The method of claim 1, wherein etching back each gate structure includes a dry etching method or a wet etching method.

13. The method of claim 1, wherein:
the semiconductor structure further includes a source-drain-doped region in the fin on both sides of each gate structure.

14. The method of claim 13, further including:
forming a through-hole in the dielectric layer connecting to the source-drain-doped region; and
filling the through-hole with a conductive layer to form a plug, the plug connecting to the source-drain-doped region.

15. A semiconductor device, comprising:
a semiconductor structure, including a semiconductor substrate, a fin over the semiconductor substrate, a plurality of gate structures across the fin, and a dielectric layer over the semiconductor substrate between adjacent gate structures, wherein a top of the dielectric layer is higher than a top of each of the plurality of gate structures to provide an opening over each of the plurality of gate structures; and
a barrier layer, formed over the dielectric layer and filling up the opening, wherein the barrier layer includes a planarized barrier layer after a gas cluster ion beam (GCIB) planarization.

16. The semiconductor device of claim 15, wherein a material of the barrier layer includes silicon nitride.

17. The semiconductor device of claim 15, wherein a distance between a top of the barrier layer and the top of the dielectric layer is controlled in a range from 0 Å to 30 Å.

* * * * *